(12) United States Patent
Qu

(10) Patent No.: US 8,454,927 B2
(45) Date of Patent: Jun. 4, 2013

(54) ALLOYED SEMICONDUCTOR NANOCRYSTALS

(75) Inventor: Lianhua Qu, Pittsburgh, PA (US)

(73) Assignee: Crystalplex Corporation, Pittsburgh, PA (US)

( * ) Notice: Subject to any disclaimer, the term of this patent is extended or adjusted under 35 U.S.C. 154(b) by 2112 days.

(21) Appl. No.: 11/197,620

(22) Filed: Aug. 4, 2005

(65) Prior Publication Data

US 2006/0028882 A1  Feb. 9, 2006

Related U.S. Application Data

(60) Provisional application No. 60/598,634, filed on Aug. 4, 2004.

(51) Int. Cl.
*C01B 19/00* (2006.01)

(52) U.S. Cl.
USPC ....... 423/508; 423/99; 423/511; 252/304.4 R; 252/301.6 R; 252/301.6 S; 252/301.4 S; 252/501.1; 252/518.1; 252/519.1; 252/519.14

(58) Field of Classification Search
USPC .......... 252/501.1, 301.4 R, 301.6 R, 301.6 S, 252/301.4 S, 518.1, 519.1, 519.14; 438/95, 438/497; 257/613, 614; 423/99, 508, 511
See application file for complete search history.

(56) References Cited

U.S. PATENT DOCUMENTS

| | | | |
|---|---|---|---|
| 4,450,150 A | 5/1984 | Sidman | |
| 5,087,616 A | 2/1992 | Myers et al. | |
| 6,225,198 B1 * | 5/2001 | Alivisatos et al. | 438/497 |
| 6,322,901 B1 | 11/2001 | Bawendi et al. | |
| 6,423,551 B1 | 7/2002 | Weiss et al. | |
| 6,699,723 B1 | 3/2004 | Weiss et al. | |
| 6,821,337 B2 | 11/2004 | Bawendi et al. | |
| 6,861,155 B2 | 3/2005 | Bawendi et al. | |
| 6,927,069 B2 | 8/2005 | Weiss et al. | |
| 7,105,051 B2 * | 9/2006 | Peng et al. | 117/68 |
| 7,125,605 B2 | 10/2006 | Bawendi et al. | |
| 7,138,098 B2 | 11/2006 | Bawendi et al. | |
| 7,193,098 B1 * | 3/2007 | Lucey et al. | 556/1 |
| 7,518,207 B1 * | 4/2009 | Chen et al. | 257/442 |
| 2005/0012182 A1 * | 1/2005 | Jang et al. | 257/613 |
| 2006/0019427 A1 * | 1/2006 | Cao | 438/95 |
| 2007/0273275 A1 * | 11/2007 | Jang et al. | 313/504 |
| 2010/0117110 A1 * | 5/2010 | Park et al. | 257/98 |
| 2010/0140586 A1 * | 6/2010 | Char et al. | 257/14 |

FOREIGN PATENT DOCUMENTS

WO    WO 2005/001889 A2    1/2005

OTHER PUBLICATIONS

Noninjection, One-Pot Synthesis of Photoluminescent Colloidal Homogeneously Alloyed CdSeS Quantum Dots. Ouyang et al. J. Phys. Chem. 2009, 113, 5193-5200.*
High quality CdSeS nanocrystals synthesized by facile single injection process and their electroluminescence. Jang et al. Chem. Commun., 2003, 2964-2965.*
Alloyed Semiconductor Quantum Dots: Tuning the Optical Properties without Changing the Particle Size, Bailey et al, JACS 125, Mar. 2003, 7100-7106.*
Kricka, ed., Nonisotopic Probing, Blotting and Sequencing, 2$^{nd}$ Ed., Academic Press, San Diego, California, 1995 (TOC).
Isaac, ed., Protocols for Nucleic Acid Analysis by Nonradioactive Probes, Humana Press, Totowa, NJ, 1994 (TOC).
Diamandis et al. eds., Immunoassay, Academic Press, Inc., San Diego, CA, 1996 (TOC).
Murray et al., Synthesis and Characterization of Nearly Monodisperse CdE (E = S, Se, Te) Semiconductor Nanocrystallites, 1993, J. Am. Chem. Soc. 115(19):8706-8715.
Qu et al., Control of Photoluminescence Properties of CdSe Nanocrystals in Growth, Feb. 6, 2002, J. Am. Chem. Soc. 124(9):2049-2055.
Qu et al., Alternative Routes Toward High Quality CdSe Nanocrystals, Jun. 13, 2001, Nanoletters, 1(6):333-337.
Qu et al., In Situ Observation of the Nucleation and Growth of CdSe Nanocrystals, Feb. 14, 2004, Nanoletters, 4(3):465-469.
Katari et al., X-Ray Photoelectron Spectroscopy of CdSe Nanocrystals with Applications to Studies of the Nanocrystal Surface, Feb. 10, 1994, J. Phys. Chem. 98(15):4109-4117.
Hines et al., Synthesis and Characterization of Strongly Luminescing ZnS-Capped CdSe Nanocrystals, Jan. 1996, J. Phys. Chem. 100(2):468-471 (Abstract).
Henglein, Small-Particle Research: Physicochemical Properties of Extremely Small Colloidal Metal and Semiconductor Particles, Dec. 1, 1989, Chem. Rev. 89(8):1861-1873.
Weller, Colloidal Semiconductor Q-Particles: Chemistry in the Transition Region Between Solid State and Molecules, 1993, Chem. Int. Ed. Engl. 32:41-53.
Murray et al., Self-Organization of CdSe Nanocrystallites Into Three-Dimensional Quantum Dot Superlattices, Nov. 24, 1995, Science 270(5240): 1335-1338.
Andres et al., Self-Assembly of a Two-Dimensional Superlattice of Molecularly Linked Metal Clusters, Sep. 20, 1996, Science 273(5282):1690-1693.
Heath et al., Spatially Confined Chemistry: Fabrication of Ge Quantum Dot Arrays, Feb. 22, 1996, J. Phys. Chem. 100(8):3144-3149.
Collier et al., Reversible Tuning of Silver Quantum Dot Monolayers Through the Metal-Insulator Transition, Sep. 26, 1997, Science 277(5334):1978-1981.

(Continued)

*Primary Examiner* — Mark Kopec
*Assistant Examiner* — Haidung Nguyen
(74) *Attorney, Agent, or Firm* — Pepper Hamilton LLP

(57) ABSTRACT

The invention relates to methods for preparing 3-element semiconductor nanocrystals of the formula $WY_xZ_{(1-x)}$, wherein W is a Group II element, Y and Z are different Group VI elements, and 0<X<1, comprising dissolving a Group II element, a first Group VI element, and a second Group VI element in a one or more solvents. The Group II, VI and VI elements are combined to provide a II:VI:VI SCN precursor solution, which is heated to a temperature sufficient to produce semiconductor nanocrystals of the formula $WY_xZ_{(1-x)}$. The solvent used to dissolve the Group II element comprises octadecene and a fatty acid. The solvent used to dissolve the Group VI elements comprises octadecene. The invention also includes semiconductor nanocrystals prepared according to the disclosed methods, as well as methods of using the semiconductor nanocrystals.

11 Claims, 2 Drawing Sheets

OTHER PUBLICATIONS

Mirkin et al., A DNA-Based Method for Rationally Assembling Nanoparticles Into Macroscopic Materials, Aug. 15, 1996, Nature 382:607-609.

Alivisatos et al., Organization of 'Nanocrystal' Molecules Using DNA, Aug. 15, 1996, Nature 382:609-611.

Colvin et al., Light-Emitting Diodes Made from Cadmium Selenide Nanocrystals and a Semiconducting Polymer, Aug. 4, 1994, Nature 370:354-357.

Dabbousi et al., Electroluminescence from CdSe Quantum-Dot/Polymer Composites, Mar. 13, 1995, Appl. Phys. Let. 66(11):1316-1318.

Danek et al., Synthesis of Luminescent Thin-Film CdSe/ZnSe Quantum Dot Composites Using CdSe Quantum Dots Passivated with an Overlayer of ZnSe, Jan. 15, 1996, Chem. Mater. 8(1):173-180 (Abstract).

Zhong et al., Composition-Tunable $Zn_xCD_{1-x}Se$ Nanocrystals with High Luminescence and Stability, 2003, J. Am. Chem. Soc. 125(28):8589-8594.

Zhong et al., Alloyed $Zn_xCd_{1-x}S$ Nanocrystals with Highly Narrow Luminescence Spectral Width, 2003, J. Am. Chem. Soc. 125(44):13559-13563.

DeLuca et al., Parenteral Drug-Delivery Systems, In Pharmaceutics and Pharmacy Practice, Banker et al. eds., J.B. Lippincott Company, Philadelphia, PA, 1982, pp. 238-250.

Trissel, ASHP Handbook on Injectable Drugs, $4^{th}$ ed., USA, 1986, pp. 622-630.

Wadhwa et al., Receptor Mediated Glycotargeting, 1995, J. Drug Targeting 3:111-127.

Huynh et al., Controlling the Morphology of Nanocrystal-Polymer Composites for Solar Cells, Jan. 2003, Advanced Functional Materials, 13(1):73-79.

Milliron et al., Electroactive Surfactant Designed to Mediate Electron Transfer Between CdSe Nanocrystals and Organic Semiconductors, Jan. 3, 2003, Advanced Materials 15(1):58-61.

Schlamp et al., Improved Efficiencies in Light Emitting Diodes Made With CdSe(CdS) Core/Shell Type Nanocrystals and a Semiconducting Polymer, Dec. 1, 1997, J. Applied Physics 82(11):5837-5842.

* cited by examiner

ALLOYED SEMICONDUCTOR NANOCRYSTALS

This application claims the benefit of and priority from U.S. provisional application Ser. No. 60/598,634, filed Aug. 4, 2004.

FIELD OF THE INVENTION

The present invention relates to methods of making alloyed semiconductor nanocrystals, nanocrystals made according to the methods, and methods of using nanocrystals made according to the methods.

BACKGROUND OF THE INVENTION

The development of sensitive nonisotopic detection systems for use in biological assays has significantly impacted many research and diagnostic areas, such as DNA sequencing, clinical diagnostic assays, and fundamental cellular and molecular biology protocols. Current nonisotopic detection methods are mainly based on organic reporter molecules that undergo enzyme-linked color changes or are fluorescent, luminescent, or electroactive (Kricka, Ed., Nonisotopic Probing, Blotting, and Sequencing, Academic Press, New York, 1995; Issac, Ed., Protocols for Nucleic Acid Analysis by Nonradioactive Probes, Humana, Totowa, N.J., 1994; and Diamandis and Christopoulos, Eds., Immunoassay, Academic Press, New York, 1996). While these nonisotopic systems solve the problems associated with radioisotopic detection, such as short half-lives of radioisotopes, health hazards and expensive removal of radioactive waste, they are not as sensitive or stable as nonisotopic detection systems that utilize luminescent semiconductor quantum dots. For example, highly luminescent semiconductor quantum dots, such as ZnS-capped CdSe quantum dots, are twenty times brighter, one hundred times more stable against photobleaching, and three times narrower in spectral line width than organic dyes, such as fluorescent rhodamine.

Over the past decade, much progress has been made in the synthesis and characterization of a wide variety of semiconductor quantum dots. Recent advances have led to large-scale preparation of relatively monodisperse quantum dots (Murray et al., JACS 115:8706-15 (1993); Qu et al. (JACS 124: 2049 (2002), Nanoletters 1:333 (2001), and Nanoletters 4:465(2004)), Bowen Katari et al., J. Phys. Chem. 98:4109-17 (1994); and Hines et al., J. Phys. Chem. 100:468-71 (1996)). Other advances have led to the characterization of quantum dot lattice structures (Henglein, Chem. Rev. 89:1861-73 (1989); and Weller et al., Chem. Int. Ed. Engl. 32:41-53(1993)) and also to the fabrication of quantum-dot arrays (Murray et al., Science 270:1335-38 (1995); Andres et al., Science 273:1690-93 (1996); Heath et al., J. Phys. Chem. 100:3144-49 (1996); Collier et al., Science 277:1978-81 (1997); Mirkin et al., Nature 382:607-09 (1996); and Alivisatos et al., Nature 382:609-11 (1996)) and light-emitting diodes (Colvin et al., Nature 370:354-57 (1994); and Dabbousi et al., Appl. Phys. Let. 66:1316-18 (1995)). In particular, IIB-VIB semiconductors have been the focus of much attention, leading to the development of a CdSe quantum dot that has an unprecedented degree of monodispersivity and crystalline order (Murray (1993), supra).

Methods of making semiconductor nanocrystals consisting of two elements are well documented in Murray et al. (JACS 115:8706 (1993)), Qu et al. (JACS 124:2049 (2002), Nanoletters 1:333 (2001), and Nanoletters 4:465(2004)), Danek et al. (Materials 8(1): 173 (January 1996)), and Hines and Guyot-Sionnest (J. Phys. Chem. 100:468 (January 1996)). Furthermore, some methods of making alloy semiconductor nanocrystals are also documented, e.g., by Xinhua Zhong et al. (JACS 125:8589 (2003) and JACS 125:12559 (2003)).

The published methods of making nanocrystals require careful timing to stop crystal growth at a desired endpoint. For two-element nanocrystal synthesis, the emission wavelength is determined solely by size and is selected by stopping crystal growth at precise times. For shorter wavelengths (smaller crystals), because of the extremely fast reaction rate, it is often exceptionally difficult to stop the reaction at the right time and/or quickly enough. In addition, the reaction rate is so greatly different from one synthesis batch to the next that the time it takes to reach the endpoint is significantly different and must be adjusted each time crystals are made. Alloy crystal emission wavelength is mostly, though not entirely, determined by current synthesis methods that still require the reaction to be stopped at carefully controlled times. Failure to do so may result in Ostwald ripening, causing a broad emission spectrum. The present invention eliminates the need for careful timing of synthesis endpoints for alloy semiconductor nanocrystals.

SUMMARY OF THE INVENTION

The present invention includes a novel method of synthesizing alloy semiconductor nanocrystals (SCNs) that eliminates the need to closely time and stop the synthesis process to achieve a desired wavelength, bandwidth or both. The present invention will produce alloy SCNs of the formula $WY_xZ_{(1-x)}$, where W is a Group II element, Y and Z are different Group VI elements, and $0<X<1$. The method also includes SCNs of the formula $WY_xZ_{(1-x)}$ prepared according to the methods of the invention, and methods of using SCNs of the formula $WY_xZ_{(1-x)}$ prepared according to the methods of the invention.

The present invention includes various methods for synthesizing 2-6-6 SCNs of the formula $WY_xZ_{(1-x)}$, wherein W is a Group II element, Y and Z are different Group VI elements, and $0<X<1$. According to one embodiment, the method comprises dissolving a Group II element, a first Group VI element, and a second Group VI element in a solvent comprising octadecene and a ligand or fatty acid to provide a 2-6-6 SCN precursor solution, and heating the 2-6-6 SCN precursor solution to a temperature sufficient to produce the 2-6-6 SCNs. According to another embodiment, the method comprises preparing a first solution by dissolving a Group II element and a first Group VI element in a first solvent comprising octadecene and a fatty acid, preparing a second solution by dissolving a second Group VI element in a second solvent comprising octadecene, mixing the first and second solutions to provide a 2-6-6 SCN precursor solution, and heating the 2-6-6 SCN precursor solution to a temperature sufficient to produce the 2-6-6 SCNs. According to another embodiment, the method comprises preparing a first solution by dissolving a Group II element in a first solvent comprising octadecene and a fatty acid, preparing a second solution by dissolving a first Group VI and a second Group VI element in a second solvent comprising octadecene, mixing the first and second solutions to provide a 2-6-6 SCN precursor solution, and heating the 2-6-6 SCN precursor solution to a temperature sufficient to produce the 2-6-6 SCNs. According to yet another embodiment, the method comprises preparing a first solution by dissolving a Group II element in a first solvent comprising octadecene and a fatty acid, preparing a second solution by dissolving a first Group VI element in a second solvent comprising octadecene, preparing a third solution by dissolving a second Group VI element in a third solvent comprising octadecene, mixing the first, second, and third solutions to provide a 2-6-6 SCN precursor solution, and heating the 2-6-6 SCN precursor solution to a temperature sufficient to produce the 2-6-6 SCNs.

According to some embodiments, the fatty acid or ligand used in dissolving the Group II element is oleic acid. In some embodiments, the Group II element is dissolved in the appropriate solvent at a temperature between about 270° C. and 330° C. Other variations of the method are included in the invention, as described herein.

The invention also comprises compositions comprising a 2-6-6 SCN prepared according to the methods described herein. The compositions of the invention may comprise a 2-6-6 SCN that is conjugated to a biological agent. The invention comprises a variety of other compositions as described herein.

The invention also comprises methods of using the compositions of the invention. According to one embodiment, the invention includes a method of detecting a target in a sample comprising contacting a sample with a 2-6-6 SCN of the invention, wherein the 2-6-6 SCN is conjugated to a biological agent, and wherein the biological agent specifically binds to a target in the sample. The method further comprises allowing the biological agent to specifically bind to the target and analyzing the sample via spectroscopy, thereby obtaining a spectroscopic signature of the sample, wherein the spectroscopic signature is indicative of the presence or the absence of the target in the sample.

Another embodiment of the invention includes a method of detecting the location of a target within a sample and comprises contacting a sample with a 2-6-6 SCN of the invention, wherein the 2-6-6 SCN is conjugated to a biological agent and wherein the biological agent specifically binds to a target in the sample. The method further comprises allowing the biological agent to specifically bind to the target and imaging the sample or a section thereof, thereby detecting the location of the target within the sample.

Yet another embodiment of the invention includes a method of monitoring a biological process in vitro comprising contacting a sample with a 2-6-6 SCN of the invention, wherein the 2-6-6 SCN is conjugated to a biological agent, wherein the biological agent specifically binds to a target in the sample, and wherein the target functions in a biological process. The method further comprises allowing the biological agent to specifically bind to the target and imaging the sample or a section thereof over a period of time or before and after a stimulus, thereby monitoring a biological process in vitro.

The invention also includes a method of detecting the location of a target in vivo comprising administering a 2-6-6 SCN of the invention to a host, wherein the 2-6-6 SCN is conjugated to a biological agent and wherein the biological agent specifically binds to a target in the host. The method further comprises allowing the biological agent to specifically bind to the target and imaging the host, a section thereof, or a cell thereof, thereby detecting the location of the target in vivo.

Another method of the invention, for monitoring a biological process in vivo, comprises administering a 2-6-6 SCN of the invention to a host, wherein the 2-6-6 SCN is conjugated to a biological agent, wherein the biological agent specifically binds to a target in the host, and wherein the target functions in a biological process. The method further comprises allowing the biological agent to specifically bind to the target and imaging the host, a section, or a cell thereof over a period of time or before and after a stimulus, thereby monitoring a biological process in vivo.

The invention includes additional methods of using the compositions of the invention, as further described herein.

DETAILED DESCRIPTION OF THE INVENTION

Methods for Preparing 2-6-6 SCNs

Figure 1:
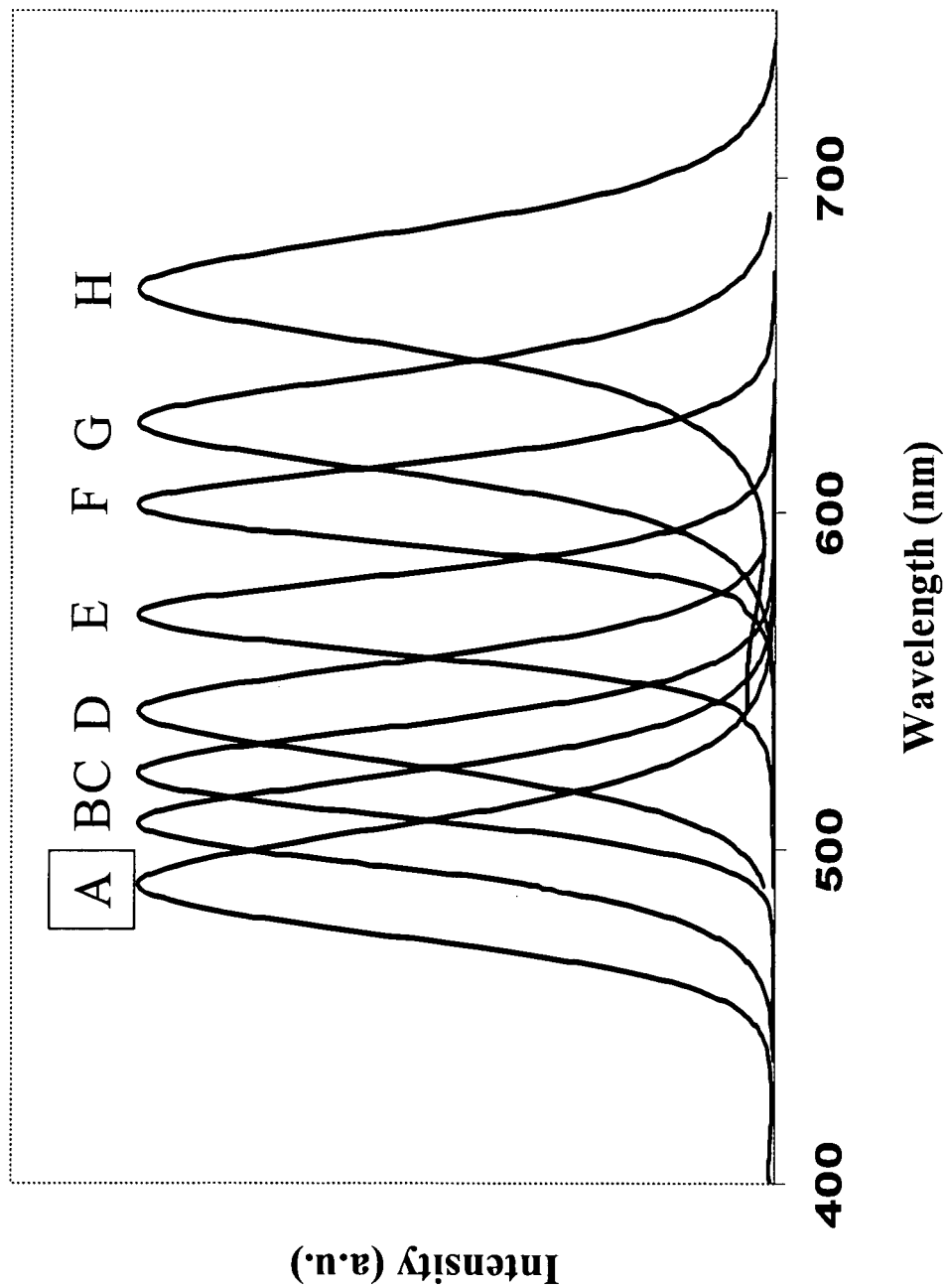
FIG. 1: Emission spectra of $CdS_xSe_{1-x}$ alloyed semiconductor nanocrystals synthesized by altering the S:Se ratio. The values of x as represented in formula $CdS_xSe_{1-x}$ and the resulting wavelengths are as follows: A: x=0.84, wavelength=490 nm; B: x=0.80, wavelength=510 nm; C: x=0.76, wavelength=525 nm; D: x=0.71, wavelength=545 nm; E: x=0.60, wavelength=575 nm; F: x=0.50, wavelength=600 nm; G: x=0.35, wavelength=630 nm; and H: x=0.15, wavelength=665 nm.

The present invention includes methods for preparing alloyed 2-6-6 SCNs of the formula $WY_xZ_{(1-x)}$, where W is a Group II element, Y and Z are different Group VI elements, and 0<X<1. The term "2-6-6 SCN" represents a 3-element alloyed semiconductor with a Group II element-Group VI element-Group VI element composition. Alloyed semiconductor nanocrystals are known in the art, for example, as described in WO 2005/001889 (Shuming Nie and Robert E. Bailey), hereby incorporated by reference in its entirety. The term "alloyed" as used herein means that the two or more semiconductors form a completely amalgamated solid wherein the two or more semiconductors are randomly distributed throughout the solid. Also, in this respect, the term "alloy" as used herein refers to any solid, which is a product of an amalgamation process. "Semiconductor" as used herein means any material that exhibits a finite band gap energy in the range of about 0.01 eV to about 10 eV.

The invention includes methods for synthesizing a preparation of 2-6-6 SCNs of the formula $WY_xZ_{(1-x)}$, wherein W is a Group II element, Y and Z are different Group VI elements, and 0<X<1. According to one embodiment, the method comprises dissolving a Group II element, a first Group VI element, and a second Group VI element in a solvent comprising octadecene and a ligand (e.g., a fatty acid) to provide a 2-6-6 SCN precursor solution. The 2-6-6 SCN precursor solution is heated to a temperature sufficient to produce the 2-6-6 SCNs. According to a second embodiment, the method comprises preparing a first solution by dissolving a Group II element and a first Group VI element in a first solvent comprising octadecene and a ligand, preparing a second solution by dissolving a second Group VI element in a second solvent comprising octadecene, and mixing the first and second solutions to provide a 2-6-6 SCN precursor solution. The 2-6-6 SCN precursor solution is heated to a temperature sufficient to produce the 2-6-6 SCNs. According to a third embodiment, the method comprises preparing a first solution by dissolving a Group II element in a first solvent comprising octadecene and a ligand, preparing a second solution by dissolving a first Group VI and a second Group VI element in a second solvent comprising octadecene, mixing the first and second solutions to provide a 2-6-6 SCN precursor solution, and heating the 2-6-6 SCN precursor solution to a temperature sufficient to produce the 2-6-6 SCNs. According to a fourth embodiment, the method comprises preparing a first solution by dissolving a Group II element in a first solvent comprising octadecene and a ligand, preparing a second solution by dissolving a first Group VI element in a second solvent comprising octadecene, preparing a third solution by dissolving a second Group VI element in a third solvent comprising octadecene, mixing the first, second, and third solutions to provide a 2-6-6 SCN precursor solution, and heating the 2-6-6 SCN precursor solution to a temperature sufficient to produce the 2-6-6 SCNs. The above embodiments of the method do not include a step to halt nanocrystal growth.

In each of the above embodiments, the elements are dissolved in a solvent comprising octadecene. The solvent used in the methods preferably comprises at least about 80% octadecene. In general, better results (in terms of higher quality nanocrystals and reaction control) are obtained by using the highest possible percentage of octadecene. Preferably, the solvent used in dissolving the Group II element comprises at least about 95% octadecene. In some embodiments, the solvent used to dissolve the Group II element or either of the Group VI elements further comprises trioctylphosphine oxide (TOPO).

According to one embodiment, the Group II element is heated (together with octadecene and a ligand) prior to combining with the Group VI elements. The Group II element can be preheated to about the same temperature that the 2-6-6 SCN precursor solution will be heated for crystal formation. Preferably, the Group II element is preheated to between about 200° C. and about 400° C., more preferably between about 250° C. and about 350° C., and even more preferably between about 270° C. and about 330° C.

According to the invention, the molar ratio of the Group II element to the sum of the Group VI elements can also be altered in the synthesis reaction, and doing so will affect the quality of the resulting nanocrystals, such as quantum efficiency and the full-width-half-max (FWHM) of the resulting crystals. Additionally, the ratio of Group II element to Group VI elements affects the reaction dynamics, such as reaction rate, free precursor concentration at different reaction stages, etc. However, altering the ratio of Group II element to Group VI elements will not alter the ratios of elements in the final 2-6-6 SCNs. In other words, the resulting 2-6-6 SCNs will be of the formula $WY_xZ_{(1-x)}$, wherein W is a Group II element, Y and Z are different Group VI elements, and $0<X<1$. In one embodiment, crystals comprising Cd, Se and S are prepared.

According to a preferred embodiment, the initial molar ratio of Cd to (Se+S) is 2:1. However, other initial ratios may be used to produce crystals comprising Cd, Se and S. The methods of the present invention can be used to tune the properties of semiconductor nanocrystals to match the application for which they are synthesized.

According to a preferred embodiment of the invention, stock solutions are prepared of the Group II and Group VI elements in their respective solvents, and aliquots of each are mixed together to provide a 2-6-6 SCN precursor solution. The 2-6-6 SCN precursor solution is stirred at a temperature that will support crystal growth, for example, between about 200° C. and about 400° C., for about 40 to about 120 minutes. It is not important to end the reaction at a specific time in order to generate nanocrystals with a specific emission wavelength. In fact, once the reaction is complete the solution can be stirred at growth temperatures for longer without altering the quality of the product. The invention does not require a step for halting nanocrystal growth. This is in sharp contrast to other methods of nanocrystal synthesis where 1-5 seconds of extra reaction time will substantially alter the product, particularly early in the reaction.

According to the invention, a ligand is included in the core synthesis reactions. The ligand can be, for example, a long chain fatty acid such as oleic acid, phosphonic acid or stearic acid.

The source of the Group II element used in the methods of the invention should be soluble in the ligand. For example, an oxide or acetate compound of the Group II element is often soluble in stearic acid. The source of both Group VI elements should be chosen such that they are soluble in an organic solvent that is miscible with the solvent/ligand system used to dissolve the Group II element. Pure Group VI elements in powder form are often suitable. Tributylphosphine (TBP) and octadecene are examples of solvents that are miscible with oleic acid. Furthermore, TBP provides a strong dipole moment, if needed, to dissolve the Group VI element. The solvents should be chosen as required by the physical properties of the elements and as required by the apparatus available for synthesis. A person skilled in the art can readily determine which solvents are appropriate.

Once the solvents and elements are chosen, solutions of the elements (or sources thereof) should be prepared so that when aliquots of each are mixed together for nanocrystal synthesis, the starting ratios of the Group VI element are such that the desired emission maximum wavelength is achieved when the synthesis is finished. The combined Group II element and Group VI elements ("2-6-6 SCN precursor solution") are then heated to a temperature sufficient to initiate and sustain nanocrystal nucleation and growth. Preferably, the temperature to which the 2-6-6 SCN precursor solution is heated will be between about 200° C. and about 400° C., more preferably between about 250° C. and about 350° C., and even more preferably between about 270° C. and about 330° C.

The present invention does not require critical timing to obtain nanocrystals with a desired emission wavelength. The emission maximum is determined by the molar ratio of the two Group VI elements, not the reaction time. The fluorescence spectrum of the resulting nanocrystals in a given preparation is not substantially altered by maintaining nanocrystal growth conditions longer than is necessary to produce the desired nanocrystals.

For a given synthesis reaction, the full width at half maximum (FWHM) will be between about 27-40 nm. Preferably, the FWHM will be between about 30-35 nm. That is, a particular 2-6-6 SCN synthesis reaction ("preparation") can be designed to produce 2-6-6 SCN preparations of a relatively narrow wavelength. If a specific wavelength is desired, one only needs to perform a few synthesis reactions using different molar ratios of Group VI elements and then fine tune the molar ratios until the desired wavelength is achieved.

The methods above produce uncapped nanocrystals, or nanocrystal "cores." Capping or adding a shell (i.e., passivating protective layer of semiconductor material surrounding the core and having a wider band gap than the core) to the 2-6-6 SCNs will increase their stability and quantum efficiency. Methods of capping with ZnS, for example, are documented in the scientific literature. Prior to capping the 2-2-6 SCNs, it is helpful, though not required, to purify the crystals. Purification of the crystals can be performed by a variety of methods known in the art; the crystals can be washed in a solvent, for example, one that will enable the crystals to precipitate out of solution. According to a preferred embodiment, the 2-6-6 SCN cores of the present invention are purified by first diluting the synthesis mixture to 7.5 times its volume with a 1:3 mixture of hexanes and butanol. The nanocrystals precipitate and can be pelleted via centrifugation. According to this embodiment, the crystals are washed by first suspending the crystals in hexanes and then adding three times the volume of methanol. The crystals re-precipitate, and after a final wash can be dissolved in hexanes for capping.

An example of a generalized protocol for synthesizing 2-6-6 SCNs (e.g., Cd:Se:S) is provided below. It consists of three steps: core synthesis, core purification, and core capping.

Core Synthesis

1) Prepare a desired amount of a Group II (e.g., cadmium) precursor by mixing the Group II compound with a octadecene (a non-chlorinating solvent) and a long chain fatty acid (e.g., oleic acid, stearic acid, phosphonic acid, etc.). Thoroughly flush the mixture with 99.999% nitrogen gas, and heat to 300° C. until the solution is clear.
2) In an oxygen free environment, prepare solutions of Group VI elements (e.g., sulfur and selenium) and mix aliquots of each, according to the desired fluorescent wavelength, so that when added to the Group II precursor solution, the molar ratios of II:VI:VI are 2:X:(1-X), where 0<X<1.
3) Dilute the mixture of Group VI elements with octadecene to 47.62% of the volume of the Group II precursor solution, while maintaining the solutions in an oxygen free environment.
4) Inject solution (3) into solution (1) at 300° C. and then maintain at 270° C. Stir until the reaction is complete (40-120 minutes) while maintaining the solution in an oxygen free environment.

The injection described above should be performed as quickly as possible; normally the injection should take less than one second.

Core Purification

Purification is performed to substantially reduce or eliminate unreacted precursors and byproducts generated during the reaction.

1) Transfer the core synthesis solution to a centrifuge tube and dilute to 7.5 times its volume with a 1:3 mixture of a nopolar and polar solvent (e.g., hexanes and butanol).
2) Centrifuge solution (1) until crystals pellet, and pour off the supernatant.
3) Wash the crystals three times with a 1:3 mixture of a nonpolar and polar solvent (e.g., hexanes and methanol). Use 6.5 times the volume of the original core synthesis solution for each wash. First add the nonpolar solvent to suspend the crystals and then add the polar solvent to precipitate them.
4) Suspend the crystals in a nonpolar solvent (e.g., hexanes) at 81% the volume of the synthesis solution.

Core Capping

Maintain an oxygen free environment during the capping process. Take a sample of the purified crystal cores and perform the steps below. The quantities indicated are for every 0.1 mmol of Group II element (e.g., cadmium) in the core solution.

1) Vacuum purge until the nonpolar solvent (e.g., hexanes) has evaporated.
2) Add 4.00 g trioctylphosphine oxide, and vacuum purge for 10 minutes. Optionally, 0.2 g stearic acid can be added along with the trioctylphospine oxide prior to performing the vacuum purge, if a shell comprising stearic acid is desired.
3) Heat to 100° C. for 30 minutes under vacuum and then to 200° C. without vacuum for 30 minutes.
4) Prepare capping solution by mixing 40 µL $Zn(CH_3)_2$, 80 µL Hexamethyldisilathiane (CAS# 3385-94-2), and 2.00 mL trioctylphosphine in an oxygen-free environment.
5) Drip the capping solution into solution (3) at 200-220° C.—it should take 5 minutes for every 2.0 mL trioctylphosphine used.
6) Stir for 30 minutes to 2 hours at 200° C. under 99.999% nitrogen.
7) Allow to cool to room temperature.

A graph of Group VI:Group VI ratios versus emission wavelength can be prepared to provide a calibration curve. The calibration curve can be used to determine the proper fraction of Group VI elements needed to obtain crystals that fluoresce at the desired wavelength.

2-6-6 SCN Compositions

The invention includes 2-6-6 SCNs of the formula $WY_xZ_{(1-x)}$, wherein W is a Group II element, Y and Z are different Group VI elements, and 0<X<1, wherein the 2-6-6 SCN is prepared according to methods of the invention. For example, according to one embodiment, the invention includes 2-6-6 SCNs of the formula $WY_xZ_{(1-x)}$, wherein the 2-6-6 SCN is prepared by dissolving a Group II element, a first Group VI element, and a second Group VI element in a solvent comprising octadecene and a ligand to provide a 2-6-6 SCN precursor solution, and heating the 2-6-6 SCN precursor solution to a temperature sufficient to produce 2-6-6 SCNs of the formula $WY_xZ_{(1-x)}$. According to a second embodiment, the invention includes 2-6-6 SCNs of the formula $WY_xZ_{(1-x)}$, wherein the 2-6-6 SCN is prepared by preparing a first solution by dissolving a Group II element and a first Group VI element in a first solvent comprising octadecene and a ligand, preparing a second solution by dissolving a second Group VI element in a second solvent comprising octadecene, mixing the first and second solutions to provide a 2-6-6 SCN precursor solution, and heating the 2-6-6 SCN precursor solution to a temperature sufficient to produce 2-6-6 SCNs of the formula $WY_xZ_{(1-x)}$. According to a third embodiment, the invention includes 2-6-6 SCNs of the formula $WY_xZ_{(1-x)}$, prepared by preparing a first solution by dissolving a Group II element in a first solvent comprising octadecene and a ligand, preparing a second solution by dissolving a first Group VI and a second Group VI element in a second solvent comprising octadecene, mixing the first and second solutions to provide a 2-6-6 SCN precursor solution, and heating the 2-6-6 SCN precursor solution to a temperature sufficient to produce 2-6-6 SCNs of the formula $WY_xZ_{(1-x)}$. According to a fourth embodiment, the invention includes 2-6-6 SCNs of the formula $WY_xZ_{(1-x)}$, wherein the 2-6-6 SCN is prepared by preparing a first solution by dissolving a Group II element in a first solvent comprising octadecene and a ligand, preparing a second solution by dissolving a first Group VI element in a second solvent comprising octadecene, preparing a third solution by dissolving a second Group VI element in a third solvent comprising octadecene, mixing the first, second, and third solutions to provide a 2-6-6 SCN precursor solution, and heating the 2-6-6 SCN precursor solution to a temperature sufficient to produce 2-6-6 SCNs of the formula $WY_xZ_{(1-x)}$.

The invention also includes 2-6-6 SCNs prepared by variations of the above methods, as described herein.

The 2-6-6 SCNs of the invention present can be of any quantum yield. The term "quantum yield" as used herein means refers to the efficiency with which the SCN converts absorbed photons into luminescence. If, for example, every photon absorbed produces a photon attributed to luminescence, then the quantum yield is 100%. However, if only one photon attributed to luminescence is emitted for every 10 absorbed photons, then the quantum yield is 10%, and so on. One of ordinary skill in the art appreciates that, in general, the higher the quantum yield, the higher the optical efficiency is, such that SCNs with high quantum yields are desirable. Preferably, the quantum yield of any of the 2-6-6 SCNs described herein is at least 15%. More preferably, the quantum yield is within the range of about 30% and about 60%, and most preferably, the quantum yield is within the range of about 40% and about 60%.

The methods of the invention can be used to produce 2-6-6 SCNs with emission spectra between about 400 and 600 nm. Preferably, the emission spectra of 2-6-6 SCNs prepared by the present invention will be between 400 and 650 nm. More preferably, the emission spectra will be between 450 and 600 nm.

The resulting 2-6-6 SCNs will be up to about 6 nm in size. Each 2-6-6 SCN of a given preparation will have a size that is within about 7% of the average size of 2-6-6 SCNs in the preparation. The full width at half maximum (FW) for a given preparation will be between about 27-40 nm; preferably, the FWHM for a given preparation will be between about 30-35 nm.

The 2-6-6 SCNs prepared according to the methods of the invention will have significantly increased photostability over nanocrystals produced by other methods, particularly those nanocrystals with shorter emission wavelengths. In a preferred embodiment, the 2-6-6 SCNs prepared according to the methods of the invention retain fluorescence intensities that are within 20% of their original fluorescence intensities after at least 10 minutes of excitation at an appropriate wavelength (i.e., a wavelength at which the 2-6-6 SCNs can be made to emit signal). More preferably, the 2-6-6 SCNs retain fluorescence intensities that are within 10% of their original fluorescence intensity after at least 10 minutes of excitation at an appropriate wavelength. Even more preferably, the 2-6-6 SCNs retain fluorescence intensities that are within 5% of their original fluorescence intensity after at least 10 minutes of excitation at an appropriate wavelength. Preferably, the 2-6-6 SCNs of the invention retain their fluorescence intensity for at least 10 minutes at the appropriate wavelength. More preferably, the 2-6-6 SCNs of the invention retain their fluorescence intensity for at least 20 minutes at the appropriate wavelength. Even more preferably, the 2-6-6 SCNs of the invention retain their fluorescence intensity for at least 30 minutes at the appropriate wavelength.

The nanocrystals of the present invention can be easily made biocompatible by using conventional functionalization methods for nanocrystals known to those of skill in the art, in order to perform biological and biomedical applications and research.

The 2-6-6 SCNs of the present invention can be conjugated to a biological agent. By "conjugated" as used herein means that the SCN is attached to a biological agent through any means, e.g., chemical bonds, electrostatic interactions, crosslinkers, and the like. As used herein the term "biological agent" refers to any molecule, entity, or part of either of the foregoing that is endogeneous to a whole organism and/or is biologically active within a whole organism. Suitable biological agents for conjugation to the 2-6-6 SCNs prepared according to the present invention are known in the art and include, for instance, a biomolecule or a drug. Preferably, the biological agent is a biomolecule, wherein "biomolecule" refers to any molecule or part thereof that is naturally-occurring within or on the body of a whole organism. Preferred biomolecules for conjugation to the 2-6-6 SCNs prepared according to the invention include a protein, a peptide, a nucleic acid molecule, a combination thereof, and the like.

Also preferred is that the biological agent is a drug, wherein "drug" as used herein refers to any chemical agent that is exogenous to the body of a whole organism and typically is synthesized by means known in the art. The 2-6-6 SCNs described herein can be conjugated to any drug. The drug may or may not be therapeutically effective to any organism. In this regard, the SCNs may be conjugated to a candidate drug wherein one of ordinary skill in the appropriate art reasonably believes that the candidate drug may have a therapeutic or beneficial effect to any whole organism.

The 2-6-6 SCNs of the present invention can have a semiconductor shell, i.e., can be encapsulated within a shell comprising a semiconductor. By "semiconductor shell" as used herein refers to a thin layer of semiconductor material (typically 1-10 atomic layers thick) deposited on the outer surface of the SCN; this "semiconductor shell" is composed of a different semiconductor material than the 2-6-6 SCN itself. The semiconductor shell should have a wider band gap than the core in order to efficiently protect the core electronically and sterically. The semiconductor shell can comprise any semiconductor. Preferably, the semiconductor shell comprises ZnS, CdS, CdSe, CdTe, GaAs, or AlGaAs.

Likewise, the 2-6-6 SCNs of the invention can be encapsulated within a polymer bead. The polymer bead can comprise any polymer. Preferably, the polymer bead comprises a polymer, such as polystyrene, brominated polystyrene, polyacrylic acid, polyacrylonitrile, polyamide, polyacrylamide, polyacrolein, polybutadiene, polycaprolactone, polycarbonate, polyester, polyethylene, polyethylene terephthalate, polydimethylsiloxane, polyisoprene, polyurethane, polyvinyl acetate, polyvinyl chloride, polyvinyl pyridine, polyvinylbenzyl chloride, polyvinyl toluene, polyvinylidene chloride, polydivinylbenzene, polymethylmethacrylate, polylactide, polyglycolide, poly (lactide-co-glycolide), polyanhydride, polyorthoester, polyphosphazene, polysulfone, or a combination or a copolymer thereof.

The 2-6-6 SCNs prepared according to the methods of the invention can be formed as a composition, such as a pharmaceutical composition. Pharmaceutical compositions containing the SCNs can comprise more than one active ingredient, such as more than one SCN conjugated to a different biological agent. The pharmaceutical composition can alternatively comprise an SCN in combination with pharmaceutically active agents or drugs other than those conjugated to them.

The compositions comprising the 2-6-6 SCNs of the invention can comprise a carrier, a diluent, or an excipient. The carrier can be any suitable carrier. Preferably, the carrier is a pharmaceutically acceptable carrier. With respect to pharmaceutical compositions, the carrier can be any of those conventionally used and is limited only by chemico-physical considerations, such as solubility and lack of reactivity with the active compound (s), and by the route of administration. It will be appreciated by one of skill in the art that, in addition to the following described pharmaceutical composition, the quantum dots of the present inventive methods can be formulated as inclusion complexes, such as cyclodextrin inclusion complexes, or liposomes.

The pharmaceutically acceptable carriers described herein, for example, vehicles, adjuvants, excipients, and diluents, are well-known to those skilled in the art and are readily available to the public. It is preferred that the pharmaceutically acceptable carrier be one which is chemically inert to the active agent(s) and one which has no detrimental side effects or toxicity under the conditions of use.

The choice of carrier will be determined in part by the particular 2-6-6 SCN and biological agent conjugated thereto, as well as by the particular method used to administer the compound, inhibitor or combination of compound and inhibitor. Accordingly, there are a variety of suitable formulations of the pharmaceutical composition of the present inventive methods. The following formulations for oral, aerosol, parenteral, subcutaneous, intravenous, intramuscular, interperitoneal, rectal, and vaginal administration are exemplary and are in no way limiting. One skilled in the art will appreciate that these routes of administering the quantum dots of the present invention are known, and, although more than one route can be used to administer a particular 2-6-6 SCN, a particular route can provide a more immediate and more effective response than another route.

Injectable formulations are among those formulations that are preferred in accordance with the present invention. The requirements for effective pharmaceutical carriers for injectable compositions are well-known to those of ordinary skill in the art (see, e.g., Pharmaceutics and Pharmacy Practice, J. B. Lippincott Company, Philadelphia, Pa., Banker and Chalmers, eds., pages 238-250 (1982), and ASEP Handbook on Injectable Drugs, Toissel, 4th ed., pages 622-630 (1986)).

Topical formulations are well-known to those of skill in the art. Such formulations are particularly suitable in the context of the present invention for application to the skin.

Formulations suitable for oral administration can consist of (a) liquid solutions, such as an effective amount of the quantum dot dissolved in diluents, such as water, saline, or orange juice; (b) capsules, sachets, tablets, lozenges, and troches, each containing a predetermined amount of the active ingredient, as solids or granules; (c) powders; (d) suspensions in an appropriate liquid; and (e) suitable emulsions. Liquid formulations may include diluents, such as water and alcohols, for example, ethanol, benzyl alcohol, and the polyethylene alcohols, either with or without the addition of a pharmaceutically acceptable surfactant. Capsule forms can be of the ordinary hard- or soft-shelled gelatin type containing, for example, surfactants, lubricants, and inert fillers, such as lactose, sucrose, calcium phosphate, and corn starch. Tablet forms can include one or more of lactose, sucrose, mannitol, corn starch, potato starch, alginic acid, microcrystalline cellulose, acacia, gelatin, guar gum, colloidal silicon dioxide, croscarmellose sodium, talc, magnesium stearate, calcium stearate, zinc stearate, stearic acid, and other excipients, colorants, diluents, buffering agents, disintegrating agents, moistening agents, preservatives, flavoring agents, and pharmacologically compatible excipients. Lozenge forms can comprise the active ingredient in a flavor, usually sucrose and acacia or tragacanth, as well as pastilles comprising the active ingredient in an inert base, such as gelatin and glycerin, or sucrose and acacia, emulsions, gels, and the like containing, in addition to the active ingredient, such excipients as are known in the art.

The 2-6-6 SCNs prepared according to the invention, alone or in combination with each other and/or with other suitable components, can be made into aerosol formulations to be administered via inhalation. These aerosol formulations can be placed into pressurized acceptable propellants, such as dichlorodifluoromethane, propane, nitrogen, and the like. They also may be formulated as pharmaceuticals for non-pressured preparations, such as in a nebulizer or an atomizer. Such spray formulations also may be used to spray mucosa.

Formulations suitable for parenteral administration include aqueous and non-aqueous, isotonic sterile injection solutions, which can contain anti-oxidants, buffers, bacteriostats, and solutes that render the formulation isotonic with the blood of the intended recipient, and aqueous and non-aqueous sterile suspensions that can include suspending agents, solubilizers, thickening agents, stabilizers, and preservatives. The 2-6-6 SCNs can be administered in a physiologically acceptable diluent in a pharmaceutical carrier, such as a sterile liquid or mixture of liquids, including water, saline, aqueous dextrose and related sugar solutions, an alcohol, such as ethanol, isopropanol, or hexadecyl alcohol, glycols, such as propylene glycol or polyethylene glycol, dimethylsulfoxide, glycerol ketals, such as 2,2-dimethyl-1,3-dioxolane-4-methanol, ethers, such as poly (ethyleneglycol) 400, an oil, a fatty acid, a fatty acid ester or glyceride, or an acetylated fatty acid glyceride with or without the addition of a pharmaceutically acceptable surfactant, such as a soap or a detergent, suspending agent, such as pectin, carbomers, methylcellulose, hydroxypropylmethylcellulose, or carboxymethylcellulose, or emulsifying agents and other pharmaceutical adjuvants.

Oils, which can be used in parenteral formulations include petroleum, animal, vegetable, or synthetic oils. Specific examples of oils include peanut, soybean, sesame, cottonseed, corn, olive, petrolatum, and mineral. Suitable fatty acids for use in parenteral formulations include oleic acid, stearic acid, and isostearic acid. Ethyl oleate and isopropyl myristate are examples of suitable fatty acid esters.

Suitable soaps for use in parenteral formulations include fatty alkali metal, ammonium, and triethanolamine salts, and suitable detergents include (a) cationic detergents such as, for example, dimethyl dialkyl ammonium halides, and alkyl pyridinium halides, (b) anionic detergents such as, for example, alkyl, aryl, and olefin sulfonates, alkyl, olefin, ether, and monoglyceride sulfates, and sulfosuccinates, (c) nonionic detergents such as, for example, fatty amine oxides, fatty acid alkanolamides, and polyoxyethylenepolypropylene copolymers, (d) amphoteric detergents such as, for example, allcyl-b-aminopropionates, and 2-alkyl-imidazoline quaternary ammonium salts, and (e) mixtures thereof.

The parenteral formulations will typically contain from about 0.5% to about 25% by weight of the active ingredient in solution. Preservatives and buffers may be used. In order to minimize or eliminate irritation at the site of injection, such compositions may contain one or more nonionic surfactants having a hydrophile-lipophile balance (HLB) of from about 12 to about 17. The quantity of surfactant in such formulations will typically range from about 5% to about 15% by weight. Suitable surfactants include polyethylene sorbitan fatty acid esters, such as sorbitan monooleate and the high molecular weight adducts of ethylene oxide with a hydrophobic base, formed by the condensation of propylene oxide with propylene glycol. The parenteral formulations can be presented in unit-dose or multi-dose sealed containers, such as ampoules and vials, and can be stored in a freeze-dried (lyophilized) condition requiring only the addition of the sterile liquid excipient, for example, water, for injections, immediately prior to use. Extemporaneous injection solutions and suspensions can be prepared from sterile powders, granules, and tablets of the kind previously described.

Additionally, the 2-6-6 SCNs prepared according to the invention, or compositions comprising such compounds, can be made into suppositories by mixing with a variety of bases, such as emulsifying bases or water-soluble bases. Formulations suitable for vaginal administration can be presented as pessaries, tampons, creams, gels, pastes, foams, or spray formulas containing, in addition to the active ingredient, such carriers as are known in the art to be appropriate.

One of ordinary skill in the art will readily appreciate that the 2-6-6 SCNs of the present inventive methods can be modified in any number of ways, such that the efficacy of an SCN is increased through the modification. For instance, an SCN or a biological agent conjugated thereto could be conjugated either directly or indirectly through a linker to a targeting moiety.

The practice of conjugating quantum dots or biological agents to targeting moieties is known in the art. See, e.g., Wadwa et al., J. Drug Targeting 3:111 (1995), and U.S. Pat.

No. 5,087,616. The term "targeting moiety" as used herein, refers to any molecule or agent that specifically recognizes and binds to a cell-surface receptor, such that the targeting moiety directs the delivery of the quantum dot and/or biological agent to a population of cells on which surface the receptor is expressed. Targeting moieties include, but are not limited to, antibodies, or fragments thereof, peptides, hormones, growth factors, cytokines, and any other naturally-or non-naturally-existing ligands, which bind to cell surface receptors. The term "linker" as used herein, refers to any agent or molecule that bridges the SCN or biological agent to the targeting moiety. One of ordinary skill in the art recognizes that sites on the SCN or biological agent, which are not necessary for the function of the SCN or biological agent, are ideal sites for attaching a linker, a targeting moiety, or both, provided that the linker and/or targeting moiety, after attached to the SCN or biological agent, do(es) not interfere with the function of the SCN or biological agent, i.e., the ability to absorb and emit detectable energy or specifically bind to a target or targets.

Alternatively, the 2-6-6 SCNs of the present invention can be modified into a depot form, such that the manner in which an SCN is released into the body to which it is administered is controlled with respect to time and location within the body (see, for example, U.S. Pat. No. 4,450,150). Depot forms of SCNs can be, for example, an implantable composition comprising the SCN and a porous material, such as a polymer, wherein the SCN is encapsulated by or diffused throughout the porous material. The depot is then implanted into the desired location within the body and the SCN is released from the implant at a predetermined rate by diffusing through the porous material.

Furthermore, the present inventive methods can comprise the administration of the 2-6-6 SCN(s), in the presence or absence of an agent that enhances its efficacy, or the methods can further comprise the administration of other suitable components, such as those that can protect the SCN and/or the biological agent from degradation within the host or those that can prevent the elimination from the host or cellular uptake of the SCN.

For purposes of the present inventive methods, the amount or dose of the 2-6-6 SCN(s) administered should be sufficient to effect a response in the animal over a reasonable time frame. Particularly, the dose of an SCN should be sufficient to allow the biological agent(s) to specifically bind to its target(s) within about 1-2 hours, if not 3-4 hours, from the time of administration. The dose will be determined by the efficacy of the particular 2-6-6 SCN and/or biological agent conjugated thereto and the condition and body weight of the animal to be treated. Many assays for determining an administered dose are known in the art. For purposes of the present invention, an assay which comprises comparing the extent to which the biological agent(s) specifically bind(s) to its target(s) within the host upon administration of a given dose of a 2-6-6 SCN to a mammal among a set of mammals that are each given a different dose of the 2-6-6 SCN(s), could be used to determine a starting dose to be administered to a mammal. The extent to which the biological agent conjugated to the SCN specifically binds to the target within the host upon administration of a certain dose can be determined through imaging the host or a section thereof.

The dose also will be determined by the existence, nature and extent of any adverse side effects that might accompany the administration of a particular 2-6-6 SCN. Ultimately, the treating physician will decide the dosage of the compound or inhibitor of the present invention with which to treat each individual patient, taking into consideration a variety of factors, such as age, body weight, general health, diet, sex, quantum dot to be administered, and route of administration.

Methods of Using 2-6-6 SCNs

The 2-6-6 SCNs of the invention are useful in a number of in vitro and in vivo methods, particularly, in the instance that the 2-6-6 SCNs are conjugated to a biological agent, such as a biomolecule or any drug, or made biocompatible by other conventional functionalization methods. As used herein, the term "in vitro" means that the method does not take place within a host. As used herein, the term "in vivo" means that the method takes place within a host or any part thereof. These methods are further provided by the present invention.

In this regard, the present invention provides a method of detecting a target in a sample. The method comprises (i) contacting a sample with a 2-6-6 SCN prepared according to methods of the invention, which is conjugated to a biological agent, wherein the biological agent specifically binds to a target in the sample, (ii) allowing the biological agent to specifically bind to the target, and (iii) analyzing the sample via spectroscopy, thereby obtaining a spectroscopic signature of the sample, wherein the spectroscopic signature is indicative of the presence or the absence of the target in the sample.

The present invention also provides a method of detecting the location of a target within a sample. The method comprises (i) contacting a sample with a 2-6-6 SCN prepared according to the invention which is conjugated to a biological agent, wherein the biological agent specifically binds to a target in the sample, (ii) allowing the biological agent to specifically bind to the target, and (iii) imaging the sample or a section thereof, thereby detecting the location of the target within the sample.

Also provided by the present invention is a method of monitoring a biological process in vitro. The method comprises (i) contacting a sample with a 2-6-6 SCN prepared according to the invention which is conjugated to a biological agent, wherein the biological agent specifically binds to a target in the sample, wherein the target functions in a biological process, (ii) allowing the biological agent to specifically bind to the target, and (iii) imaging the sample or a section thereof over a period of time or before and after a stimulus, thereby monitoring a biological process in vitro.

The present invention provides a method of detecting the location of a target in vivo. The method comprises (i) administering to a host a 2-6-6 SCN prepared according to the invention which is conjugated to a biological agent, wherein the biological agent specifically binds to a target in the host, (ii) allowing the biological agent to specifically bind to the target, (iii) imaging the host, a section thereof, or a cell thereof, thereby detecting the location of the target in vivo.

The present invention provides a method of monitoring a biological process in vivo. The method comprises (i) administering to a host a 2-6-6 SCN prepared according to the invention which is conjugated to a biological agent, wherein the biological agent specifically binds to a target in the host, wherein the target functions in a biological process, (ii) allowing the biological agent to specifically bind to the target, and (iii) imaging the host, a section, or a cell thereof over a period of time or before and after a stimulus, thereby monitoring a biological process in vivo.

Likewise, the 2-6-6 SCNs prepared according to the invention are useful in a number of in vitro and in vivo methods, especially in the case that each of SCNs of a population of 2-6-6 SCNs is conjugated to a different biological agent, such that each of the different biological agents corresponds to a 2-6-6 SCN having a unique molar ratio of the Group VI semiconductors. One of ordinary skill in the art appreciates that use of such a population of 2-6-6 SCNs can provide simultaneous detection or monitoring of more than one target.

In this regard, the present invention also provides a method of detecting more than one target in a sample. The method comprises (i) contacting a sample with a population of 2-6-6 SCNs prepared according to the invention, wherein each of the quantum SCNs is conjugated to a different biological agent, wherein each of the biological agents specifically bind to a different target in the sample, (ii) allowing the biological agents to specifically bind to the targets, and (iii) analyzing the sample via spectroscopy, thereby obtaining a spectroscopic signature of the sample, wherein the spectroscopic signature is indicative of the presence or absence of the more than one target in the sample, thereby detecting more than one target in a sample.

The present invention also provides a method of detecting the location of more than one target within a sample. The method comprises (i) contacting a sample with a population of 2-6-6 SCNs prepared according to the invention, wherein each of the SCNs is conjugated to a different biological agent, wherein each of the biological agents specifically binds to a different target in the sample, (ii) allowing the biological agents to specifically bind to the targets, (iii) imaging the sample or a section thereof, thereby detecting the location of the more than one target within the sample.

Further provided by the present invention is a method of monitoring a biological process in vitro. The method comprises (i) contacting a sample with a population of 2-6-6 SCNs prepared according to the invention, wherein each of the SCNs is conjugated to a different biological agent, wherein each of the biological agents specifically binds to a different target in the sample, wherein each of the targets functions in a biological process, (ii) allowing the biological agents to specifically bind to the targets, and (iii) imaging the sample or a section thereof over a period of time or before and after a stimulus, thereby monitoring a biological process in vitro.

A method of detecting the location of more than one target in vivo is provided by the present invention. The method comprises (i) administering to a host a population of 2-6-6 SCNs prepared according to the invention, wherein each of the SCNs is conjugated to a different biological agent, wherein each of the biological agents specifically binds to a different target in the host, (ii) allowing the biological agents to specifically bind to the targets, (iii) imaging the host, a section thereof, or a cell thereof, thereby detecting the location of the more than one target in vivo.

The present invention also provides a method of monitoring a biological process in vivo. The method comprises (i) administering to a host a population of 2-6-6 SCNs prepared according to the invention, wherein each of the SCNs is conjugated to a different biological agent, wherein each of the biological agents specifically binds to a different target in the host, wherein each of the targets functions in a biological process, (ii) allowing the biological agents to specifically bind to the targets, and (iii) imaging the host, a sample thereof, or a section thereof over a period of time or before and after a stimulus, thereby monitoring a biological process in vivo.

As used herein, the term "target" refers to any entity that specifically binds to a biological agent conjugated to a SCN. The target can be, for instance, a protein, a nucleic acid molecule, a fragment of either of the foregoing, a small-molecule drug, a cell, a tissue, or a drug metabolite. Suitable targets that are proteins include, but are not limited to, antibodies, or fragments thereof, peptides, hormones, growth factors, cytokines, tumor-associated proteins, cell-surface receptors, coagulation factors, proteins associated with a disease or a condition, and the like. One of ordinary skill in the art realizes that the phrase "specifically binds to" generally means that the binding occurs in such a manner that excludes the binding of most other entities within the sample or host. A target-biological agent binding interaction typically has a dissociation constant, KD, within the range of about micromolars to about picomolars.

With respect to the present in vitro methods, i.e., the method of detecting a target in a sample, the method of detecting more than one target in a sample, and the method of monitoring a biological process in vitro, the sample can be any sample, such as blood, lymph, ductal fluid, tissue, cell cultures, a single cell, urine, a biopsy, and the like. The sample can also be obtained from any source, such as a host, an animal, a cultured cell line, a plant, and a tumor.

In one embodiment of the invention, the source can represent a normal, undiseased state. Alternatively, the source, such as the mammal, has a disease or a condition, such that the method achieves detection or prognosis of the disease or the condition. In a preferred embodiment of the invention, the disease is cancer including, but not limited to, lung cancer, brain cancer, ovarian cancer, uterine cancer, testicular cancer, lymphoma, leukemia, stomach cancer, pancreatic cancer, skin cancer, breast cancer, adenocarcinoma, glioma, bone cancer, and the like. The present inventive methods of detecting cancer are particularly useful for detecting skin and breast tumors that are located close to the skin surface.

In some of the methods described herein, a sample is analyzed via spectroscopy in order to obtain a spectroscopic signature. By "spectroscopy" as used herein is meant any technique for analyzing molecules based on how they absorb radiation. One of ordinary skill in the art realizes that many methods of spectroscopy are known in the art, including, for instance, ultraviolet-visible (IJV-VIS) spectroscopy, infrared (IR) spectroscopy, fluorescence spectroscopy, Raman spectroscopy, mass spectrometry, and nuclear magnetic resonance (NMR). For the present invention, the sample preferably is analyzed via fluorescence spectroscopy. More preferably, the sample is analyzed via visible to infrared fluorescence spectroscopy and, most preferably, the sample is analyzed via far-red and near-infrared fluorescence. The term "spectroscopic signature" as used herein refers to a resulting pattern, plot, or spectrum obtained upon performing spectroscopy on a sample. The spectroscopic signature obtained of a sample containing a biological agent bound to a target can be compared to a control spectroscopic signature, wherein the target is not present in the sample or host.

In addition to the present inventive methods of using the 2-6-6 SCNs prepared according to the present invention, the SCNs can be used in optoelectronic methods or as optoelectronic devices. For example, the SCNs can be used as light emitting diodes or as solar cells. See, e.g., Huynh, et al., Advanced Functional Materials, 13:73-79 (2003), Milliron, et al., Advanced Materials, 15:58-61 (2003), Schlamp, et al., Journal of Applied Physics, 82:5837-5842 (1997). The SCNs can be used in lieu of bulk materials when the bulk materials with the desired electronic properties are not available. In this instance, the SCNs would be arranged and deposited onto a substrate, for example, in an array as a thin film or layers of thin films on a support substrate or as a coating on or around another electronic material. Subsequently the support substrate and layered SCN film or other coated electronic material can be processed as needed in similar fashion to bulk semiconductor materials with the unique properties of the SCNs now available for use in electronic and optoelectronic devices.

The examples below illustrate how to create a calibration curve by simply performing a number of syntheses using different molar ratios of Group VI elements.

EXAMPLE 1

Core Synthesis

Octadecene (4.00 mL) was mixed with oleic acid (200 µL) and added to CdO (0.1 mmol) in a three neck round bottom flask. The flask was flushed with 99.999% nitrogen for 20 minutes and then heated to 300° C. until the solution was clear. Stock solutions of selenium and sulfur were prepared in a glove box under 99.999% nitrogen. Selenium powder (1.00 g) was mixed with tributylphosphine (10.00 mL) and sulfur powder (0.40 g) was mixed with octadecene (20.00 mL). 20 µL selenium precursors were mixed with 1.2 mL sulfur precursors in a 20 mL glass vial, diluted to 2.00 mL with octadecene, and then added to the cadmium precursors via a needle syringe (with injection taking less than one second) and stirred for 60 minutes, or until no change in emission wavelength was observed. This produced cores that fluoresce at 525 nm.

Purification

The entire core solution was added to a 50 mL conical centrifuge tube and 10 mL of hexanes and 30 mL of butanol were added. The crystals were centrifuged (2,680 G for 10 minutes) and the supernatant was discarded. The crystals were washed three times by being suspended in hexanes (10 mL), precipitated with methanol (30 mL) and centrifuged (2,680 G for 10 minutes). The crystals were suspended in 5 mL hexanes.

Capping

The crystals were transferred to a three neck round bottom flask and the solvent was removed by vacuum. Trioctylphosphine oxide was added (4.00 g) and the flask was vacuum purged for 10 minutes and then heated to 100° C. for 30 minutes under vacuum; the vacuum was then turned off and the flask was placed under a nitrogen flow and heated to 200° C. for another 30 minutes. While the cores were heating, the capping solution was prepared in a glove box as follows. Dimethyl zinc (40 µL) was mixed with hexamethyldisilathiane (80 µL, CAS# 3385-94-2) and trioctylphosphine (2.00 mL). The capping solution was put in a syringe, removed from the glovebox, and added to the cores drop-by-drop over five minutes. The resulting solution was stirred for two hours at 200° C. and then allowed to cool to room temperature.

EXAMPLES 2-8

The above procedure was conducted for Examples 2-7, except that the percentage of sulfur and selenium were changed as indicated in the table below.

| Example | Selenium fraction | Sulfur fraction | Emission maximum (nm) |
|---|---|---|---|
| 2 | .10 | .90 | 460 |
| 3 | .15 | .85 | 480 |
| 4 | .20 | .80 | 510 |
| 5 | .25 | .75 | 530 |
| 6 | .30 | .70 | 550 |
| 7 | .40 | .60 | 575 |
| 8 | .50 | .50 | 600 |

EXAMPLE 9

In a similar way, $CdS_xSe_{1-x}$ alloyed semiconductor nanocrystals were prepared using varying ratios of S:Se where the value of x in the resulting $CdS_xSe_{1-x}$ alloyed semiconductor nanocrystals ranged from 0.15 to 0.84. FIG. 1 shows the emission spectra of the resulting $CdS_xSe_{1-x}$ alloyed semiconductor nanocrystals. The values of x and the resulting wavelengths for samples A through H were as follows: A: x=0.84, wavelength=490 nm; B: x=0.80, wavelength=510 nm; C: x=0.76, wavelength=523 nm; D: x=0.71, wavelength=545 nm; E: x=0.60, wavelength=575 nm; F: x=0.05, wavelength=600 nm; G: x=0.35, wavelength=630 nm; and H: x=0.15, wavelength=665 nm.

The data from Examples 2-9 can be graphed to provide a calibration curve to determine the proper fraction of selenium and sulfur for the desired wavelength by plotting emission maximum on the X-axis and selenium fraction on the Y-axis.

The examples have been provided for crystals comprising Cd, Se, and S, but one skilled in the art can use the method of the present invention to create calibration curves for other 2-6-6 SCNs.

EXAMPLE 10

Figure 2:
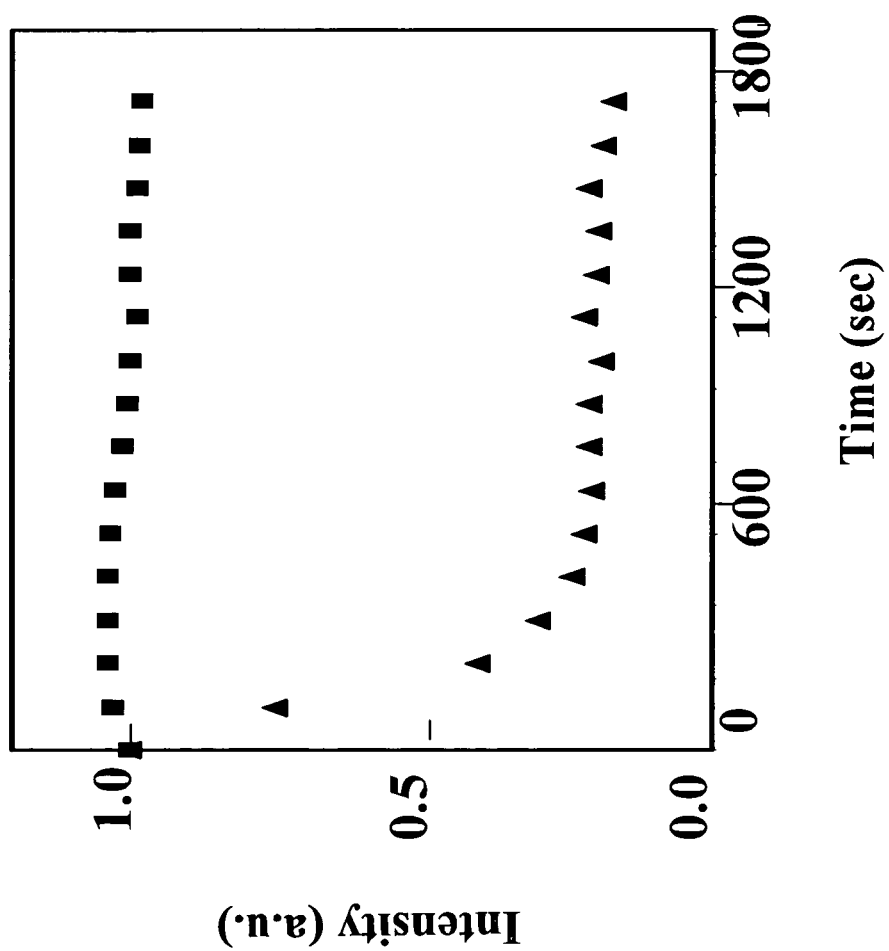
FIG. 2: Photostability comparison of alloyed nanocrystals made by the present invention and nanocrystals made by a conventional method.

FIG. 2 provides the results of a photostability comparison of alloyed nanocrystals prepared according to the present invention and nanocrystals made by a conventional method (commercially available). Both nanocrystal samples were illuminated by a UV light source and emission spectra intensities were measured at the indicated time intervals. The two nanocrystal samples have the same emission wavelength at 525 nm. The intensity values were then plotted against the illumination time. Squares (■) represent nanocrystals prepared according to present invention. Triangles (▲) represent commercially available nanocrystals.

What is claimed is:

1. A method for synthesizing 2-6-6 semiconductor nanocrystals (SCNs) of the formula $WY_xZ_{(1-x)}$, wherein W is a Group II element, Y and Z are different Group VI elements, and 0<X<1, comprising:
    heating a 2-6-6 SCN precursor solution comprising a Group II element, a first Group VI element, and a second Group VI element in one or more solvents together comprising octadecene and a fatty acid to a temperature sufficient to produce said 2-6-6 SCNs.

2. The method of claim 1, wherein said 2-6-6 SCN precursor is prepared by:
    dissolving a Group II element, a first Group VI element, and a second Group VI element in a solvent comprising octadecene and a fatty acid to provide said 2-6-6 SCN precursor solution.

3. The method of claim 1, wherein said 2-6-6 SCN precursor is prepared by
    preparing a first solution by dissolving a Group II element and a first Group VI element in a first solvent comprising octadecene and a fatty acid;
    preparing a second solution by dissolving a second Group VI element in a second solvent comprising octadecene;
    mixing said first and second solutions to provide a 2-6-6 SCN precursor solution.

4. The method of claim 1, wherein said 2-6-6 SCN precursor is prepared by:
    preparing a first solution by dissolving a Group II element in a first solvent comprising octadecene and a fatty acid;

preparing a second solution by dissolving a first Group VI and a second Group VI element in a second solvent comprising octadecene;

mixing said first and second solutions to provide a 2-6-6 SCN precursor solution.

5. The method of claim 1, wherein said 2-6-6 SCN precursor is prepared by:

preparing a first solution by dissolving a Group II element in a first solvent comprising octadecene and a fatty acid;

preparing a second solution by dissolving a first Group VI element in a second solvent comprising octadecene;

preparing a third solution by dissolving a second Group VI element in a third solvent comprising tributylphosphine;

mixing said first, second, and third solutions to provide a 2-6-6 SCN precursor solution.

6. The method of claim 2 wherein said fatty acid is oleic acid.

7. The method of claim 1 wherein said temperature is between about 270° C. and 330° C.

8. The method of claim 3 wherein said Group II element is dissolved in said first solvent at a temperature between about 270° C. and 330° C.

9. The method of claim 4 wherein said Group II element is dissolved in said first solvent at a temperature between about 270° C. and 330° C.

10. The method of claim 5 wherein said Group II element is dissolved in said first solvent at a temperature between about 270° C. and 330° C.

11. The method of claim 1, wherein the synthesis of the 2-6-6 semiconductor proceeds to completion without a step to halt nanocrystal growth.

\* \* \* \* \*